United States Patent
Yokoi et al.

(10) Patent No.: US 8,685,910 B2
(45) Date of Patent: Apr. 1, 2014

(54) CLEANING LIQUID USED IN PHOTOLITHOGRAPHY AND A METHOD FOR TREATING SUBSTRATE THEREWITH

(75) Inventors: Shigeru Yokoi, Kanagawa-ken (JP); Kazumasa Wakiya, Kanagawa-ken (JP); Koji Saito, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 403 days.

(21) Appl. No.: 12/845,085

(22) Filed: Jul. 28, 2010

(65) Prior Publication Data

US 2010/0304312 A1 Dec. 2, 2010

Related U.S. Application Data

(63) Continuation of application No. 11/546,440, filed on Oct. 12, 2006, now abandoned, which is a continuation of application No. 10/681,141, filed on Oct. 9, 2003, now abandoned.

(30) Foreign Application Priority Data

Oct. 10, 2002 (JP) ................. 2002-297009

(51) Int. Cl.
- *C11D 7/50* (2006.01)
- *C11D 11/00* (2006.01)

(52) U.S. Cl.
- CPC ................. *C11D 11/0047* (2013.01)
- USPC ......................... 510/175; 510/176

(58) Field of Classification Search
- CPC .................................................. C11D 11/0047
- USPC ................................................. 510/175, 176
- See application file for complete search history.

(56) References Cited

U.S. PATENT DOCUMENTS

| | | | |
|---|---|---|---|
| 5,597,678 A | 1/1997 | Honda et al. | |
| 5,792,274 A | 8/1998 | Tanabe et al. | |
| 5,795,702 A | 8/1998 | Tanabe et al. | |
| 5,905,063 A | 5/1999 | Tanabe et al. | |
| 5,968,848 A | 10/1999 | Tanabe et al. | |
| 6,040,117 A * | 3/2000 | Ota et al. | 430/311 |
| 6,068,000 A | 5/2000 | Tanabe et al. | |
| 6,218,087 B1 | 4/2001 | Tanabe et al. | |
| 6,261,745 B1 | 7/2001 | Tanabe et al. | |
| 6,319,835 B1 | 11/2001 | Sahbari et al. | |
| 6,440,326 B1 * | 8/2002 | Maruyama et al. | 252/79.1 |
| 6,475,966 B1 * | 11/2002 | Sahbari | 510/175 |
| 6,531,436 B1 * | 3/2003 | Sahbari et al. | 510/176 |
| 6,551,973 B1 * | 4/2003 | Moore | 510/176 |
| 6,638,899 B1 | 10/2003 | Wakiya et al. | |
| 6,797,682 B2 * | 9/2004 | Hara et al. | 510/175 |
| 2001/0021489 A1 | 9/2001 | Wakiya et al. | |
| 2002/0128164 A1 * | 9/2002 | Hara et al. | 510/175 |
| 2002/0146647 A1 | 10/2002 | Aoki et al. | |
| 2003/0100459 A1 | 5/2003 | Yoon et al. | |
| 2003/0114014 A1 * | 6/2003 | Yokoi et al. | 438/745 |
| 2003/0134234 A1 | 7/2003 | Wakiya et al. | |
| 2003/0138737 A1 * | 7/2003 | Wakiya et al. | 430/331 |
| 2004/0106532 A1 | 6/2004 | Yokoi et al. | |
| 2004/0121937 A1 * | 6/2004 | Yokoi et al. | 510/504 |

FOREIGN PATENT DOCUMENTS

| | | |
|---|---|---|
| JP | 7-28254 | 1/1995 |
| JP | 8-301911 | 11/1996 |
| JP | 10-239865 | 9/1998 |
| JP | 2001-215736 | 8/2001 |
| JP | 2001-324823 | 11/2001 |
| KR | 1998-71603 | 10/1998 |

\* cited by examiner

*Primary Examiner* — Gregory Webb

(74) *Attorney, Agent, or Firm* — Wenderoth, Lind & Ponack, L.L.P.

(57) ABSTRACT

It is disclosed a cleaning liquid for stripping and dissolving a photoresist pattern having a film thickness of 10-150 μm, which contains (a) 0.5-15 mass % of a quaternary ammonium hydroxide, such as tetrapropylammonium hydroxide and tetrabutylammonium hydroxide, (b) 65-97 mass % of a water-soluble organic solvent, such as dimethylsulfoxide or a mixed solvent thereof with N-methyl-2-pyrrolidone, sulforane, etc., and (c) 0.5-30 mass % of water, and a method for treating a substrate therewith.

10 Claims, No Drawings

CLEANING LIQUID USED IN PHOTOLITHOGRAPHY AND A METHOD FOR TREATING SUBSTRATE THEREWITH

This application is a Continuation of U.S. application Ser. No. 11/546,440, filed Oct. 12, 2006, now abandoned, which is a Continuation of U.S. application Ser. No. 10/681,141 filed Oct. 9, 2003, now abandoned.

BACKGROUND OF THE INVENTION

1. Field of the Invention

The present invention relates to a cleaning liquid used in photolithography for stripping and dissolving a thick photoresist pattern, and a method for treating a substrate therewith. The cleaning liquid of the invention is suitably applied especially for the formation of a bump in the production of a semiconductor device, such as IC and LSI.

2. Description of Related Art

In recent years, with the highly integration of semiconductor devices such as IC and LSI and downsizing of chip size, it has been required to micronize metallic wirings and to align bumps (minute salient electrodes) having a height of 20 μm or more on a substrate with high precision as connection terminals. In future, in conformity to further downsizing of chip size, highly precision of metallic wirings and bumps will become further necessary.

The bump formation is carried out by, for example, providing a metallic thin film on a substrate, forming a thick photoresist pattern on the metallic thin film by photolithography technique, providing a conductive layer on the photoresist pattern-uncovered area (i.e., a metallic thin film-exposed area) of the substrate to form bumps, and then removing the photoresist pattern.

Since the photoresist pattern is formed thickly usually in a film thickness of about 10-150 μm, the photoresist to be used is preferred negative-working photoresist materials in view of resistance to plating, pattern shape property, etc. However, it is difficult in removing photoresist pattern made of the negative-working photoresist materials as compared with the one made of positive-working photoresist materials. Thus, it is much more difficult in removing a thickly formed photoresist pattern made of the negative-working photoresist materials.

Further, during the formation process of the thick photoresist pattern, it is inevitable the pattern is liable to cause deformation in its shape, such as collapse and deficiency, because of its heavy film thickness. In such a case, it is necessary to discontinue the subsequent process and to carry out a re-work by removing away the deformed photoresist pattern from the substrate on the way of the works and do over again the formation of the photoresist pattern process from the first.

In any case of the removal of the photoresist pattern after the bump formation or the removal of the photoresist pattern for the re-work, after the immersion of the substrate having thereon a thick photoresist pattern in a cleaning liquid tank and thereby stripping (falling down) the pattern from the substrate, it is required the stripped-away photoresist pattern (cured material) be rapidly and completely dissolved in the cleaning liquid tank. When the stripped-away photoresist pattern remains in the cleaning liquid tank in a state of being insufficiently dissolved, there is the fear of a re-adhesion of the remaining cured photoresist pattern to the substrate, or in a continuous processing, to the subsequent substrate to be treated, which cause the inefficiency of the production. The prevention of corrosion of the metallic thin film is also required. In addition, in forming a bump on the substrate, a degenerated film is possibly formed at the interface between the photoresist pattern and the bump. It is therefore necessary to prevent the formation of such a degenerated film and to prevent the bump from corrosion.

JP-A-08-301911 describes a radiation-sensitive resin composition as a pattern forming material for the use of a bump formation and discloses in paragraph Nos. [0032] and [0043] a mixture of a quaternary ammonium, dimethyl sulfoxide and water (specifically, a dimethyl sulfoxide solution of 0.5 mass % of tetramethylammonium hydroxide (containing 1.5 mass % of water)) as a stripping liquid for stripping a photo-cured pattern. However, this stripping liquid involves problems such that it takes a time to dissolve the photo-cured pattern that was stripped away from the substrate in the stripping liquid, and that the throughput is low.

JP-A-10-239865 describes a formulation containing specific amounts of dimethyl sulfoxide, 1,3-dimethyl-2-imidazolidinone, a tetraalkylammonium hydroxide, and water as a stripping liquid for stripping a negative-working photoresist for forming a bump. As is the case of JP-A-08-301911 above, JP-A-10-239865 also involves problems such that it takes a time to dissolve the photo-cured pattern that was stripped away from the substrate in the stripping liquid, and that the throughput is low. Further, the stripping solution in JP-A-10-239865 contains 1,3-dimethyl-2-imidazolidinone as an essential component. This compound causes discoloration or corrosion of Cu.

In the photolithographic field, JP-A-2001-324823, JP-A-07-028254, etc., disclose stripping liquids containing a quaternary ammonium hydroxide and a water-soluble organic solvent such as dimethyl sulfoxide. However, none of those describe at all the removability of the hardly removable photoresists that are suitably used for forming a thick pattern for the formation of a bump.

SUMMARY OF THE INVENTION

The object of the invention is to provide a cleaning liquid capable of not only stripping a thick photoresist pattern to be used for bump formation, etc., from a substrate but also rapidly and completely dissolving the stripped photoresist pattern without causing re-adhesion to the substrate or the subsequent substrate(s), and a method for treating a substrate using the cleaning liquid.

The present invention is to provide a cleaning liquid for stripping and dissolving a photoresist pattern having a film thickness of 10-150 μm, which contains (a) 0.5-15 mass % of a quaternary ammonium hydroxide represented by the following general formula (I):

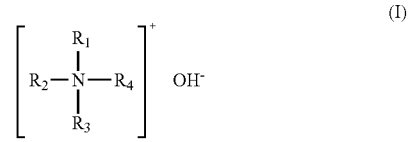

wherein all groups or at least three groups of $R_1$, $R_2$, $R_3$, and $R_4$ each independently represents an alkyl group or a hydroxyalkyl group each having 3-6 carbon atoms, and one group of $R_1$, $R_2$, $R_3$, and $R_4$ may represent an alkyl group or a hydroxyalkyl group each having 1-6 carbon atoms, (b) 65-97 mass % of a water-soluble organic solvent, and (c) 0.5-30 mass % of water.

Also, the present invention is to provide a method for treating a substrate, comprising forming a photoresist pattern having a film thickness of 10-150 μm on a substrate having a metallic thin film thereon, providing a conductive layer on a metallic thin film-exposed area or a photoresist pattern uncovered area, and bringing the photoresist pattern into contact with the cleaning liquid to strip and dissolve the photoresist pattern.

Also, the present invention is to provide a method for treating a substrate, comprising forming a photoresist pattern having a film thickness of 10-150 μm on a substrate having a metallic thin film thereon, bringing the photoresist pattern into contact with the cleaning liquid to strip and dissolve the photoresist pattern, without providing a conductive layer on a metallic thin film-exposed area or a photoresist pattern uncovered area.

DETAILED DESCRIPTION OF THE INVENTION

The cleaning liquid of the invention is used for stripping and dissolving a photoresist pattern having a film thickness of 10-150 μm, that is formed on a substrate having a metallic thin film thereon. Component (a) in the stripping liquid is a quaternary ammonium hydroxide represented by the following general formula (I):

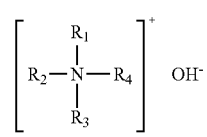

wherein all groups or at least three groups of $R_1$, $R_2$, $R_3$, and $R_4$ each independently represents an alkyl group or a hydroxyalkyl group each having 3-6 carbon atoms, and one group of $R_1$, $R_2$, $R_3$, and $R_4$ may represent an alkyl group or a hydroxyalkyl group each having 1-6 carbon atoms. In the case where all groups or at least three groups of $R_1$, $R_2$, $R_3$, and $R_4$ have less than 3 carbon atoms, corrosion of the metallic thin film (especially, Cu, etc.) occurs.

Specific examples of component (a) include tetrapropylammonium hydroxide, tetrabutylammonium hydroxide, methyltripropylammonium hydroxide, and methyltributylammonium hydroxide. Among all, tetrapropylammonium hydroxide is the most preferable in view of the strippability and solubility of the photoresist pattern (cured pattern) in the cleaning liquid as well as the anti-corrosiveness of an easily corrosive metal such as Cu. Component (a) may be used singly or in admixture of two or more thereof.

The amount of component (a) is 0.5-15 mass %, and preferably 1-10 mass % in the cleaning liquid of the invention. When the amount of component (a) is less than 0.5 mass %, it is difficult to sufficiently remove the photoresist pattern, whereas when it exceeds 15 mass %, a corrosion is liable to occur to the metallic thin film (such as Cu) or an Si substrate.

The water-soluble organic solvent as component (b) may be an organic solvent miscible with water and other compounding components, and conventional cones may be employed. Specific examples include sulfoxides, such as dimethyl sulfoxide; sulfones, such as dimethylsulfone, diethylsulfone, bis(2-hydroxyethyl)sulfone, and tetramethylenesulfone (i.e., sulforane); amides, such as N,N-dimethylformamide, N-methylformamide, N,N-dimethylacetamide, N-methylacetamide, and N,N-diethylacetamide; lactams, such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; and polyhydric alcohols and derivatives thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol monomethyl ether, propylene glycol monoethyl ether, propylene glycol monopropyl ether, and propylene glycol monobutyl ether. In the present invention, in view of the prevention of corrosion of a metal and the prevention of discoloration, it is undesirable to use imidazolidinones, such as 1,3-dimethyl-2-imidazolidinone, 1,3-diethyl-2-imidazolidinone, and 1,3-diisopropyl-2-imidazolidinone.

As component (b) in the invention, it is preferable to use dimethyl sulfoxide singly or a mixed solvent of dimethyl sulfoxide and other water-soluble organic solvent(s). Among all, it is preferable to use a mixed solvent of dimethyl sulfoxide and N-methyl-2-pyrrolidone and/or sulforane in view of both of the strippability and solubility of the photoresist pattern in the cleaning liquid of the invention and the anti-corrosiveness of Cu. Specifically, a mixed solvent of dimethyl sulfoxide and N-methyl-2-pyrrolidone is the most preferable as its superiorities both in the strippability of the photoresist pattern in the solvent and in the dissolubility of the photoresist pattern in the solvent. The mixing ratio of dimethyl sulfoxide to other water-soluble organic solvent is preferably from about 8/1 to 1/8 (by mass ratio). Component (b) may be used singly or in admixture of two or more thereof.

The amount of component (b) is 65-97 mass %, and preferably 70-96 mass % in the cleaning liquid of the invention. When the amount of component (b) is less than 65 mass %, corrosion of the metallic thin film, the bumps, and the Si substrate is liable to occur, whereas when it exceeds 97 mass %, the strippability and solubility of the photoresist pattern in the cleaning liquid is lowered.

The amount of water as component (c) is 0.5-30 mass %, and preferably 1-25 mass % in the cleaning liquid of the invention. When the amount of component (c) is less than 0.5 mass %, the strippability and solubility of the photoresist pattern in the cleaning liquid is insufficient, whereas when it exceeds 30 mass %, corrosion of the metallic thin film, the bumps, and the Si substrate is liable to occur.

For the thick photoresist pattern, which is an object to be stripped away and dissolved by the cleaning liquid of the invention, any photoresist compositions for forming a thick pattern for the formation of a bump can be widely employed. Photopolymerization type negative-working photoresist compositions and chemical amplification type negative-working photoresist compositions are currently mainly employed for such photoresist compositions for use in forming thick patterns. The cleaning liquid of the invention exhibits its advantageous effects to the above currently mainly used photoresist compositions, but not limited thereto: It has been confirmed that the cleaning liquid of the invention also exhibits its advantageous effects to the positive-working photoresist compositions for i-rays and chemical amplification type positive-working photoresist compositions.

Among the foregoing various photoresist compositions, it is said the photopolymerization type negative-working photoresist compositions, that are polymerized upon irradiation with radiations and become insoluble in alkalis, are mostly difficult-to-be-stripped away and difficult-to-be-dissolved in cleaning solutions in photolithography processes. The cleaning liquid of the invention can effectively strip away and dissolve such photopolymerization type negative-working photoresist compositions.

Examples of the photopolymerization type negative-working photoresist compositions include the ones containing a polymer component [such as (meth)acrylate, cyclic alkyl group-containing (meth)acrylate, and styrene based polymers], a photopolymerization initiator, a solvent, and a crosslinking agent as the main constitutional components.

Examples of the chemical amplification type negative-working photoresist compositions include the ones containing a polymer component (such as novolak resins), a crosslinking agent, a photo acid generator, and a solvent as the constitutional components.

An embodiment of the use of the cleaning liquid of the invention and that of the method for treating a substrate using the cleaning liquid will be described below, however, the present invention is not limited thereto.

A negative-working photoresist coating liquid, which is polymerized upon irradiation with radiations and becomes insoluble in alkalis, is coated on a substrate having a metallic thin film thereon by known methods, such as a spin coating method and a roll coating method, and then dried to make a photoresist layer.

Examples of the metallic thin film include Cu, Cu alloys, μl, Al alloys, Ni, Au, and Pd. The formation of the metallic thin film is carried out by, for example, a CVD vapor deposition method, a sputtering method, an electroplating method, etc., but is not limited thereto.

Then, the photoresist layer is irradiated with radiations through a mask pattern and is selectively exposed. In the above negative-working photoresist, the light-exposed area is cured by photopolymerization to become a photo-cured area. The radiations include ultraviolet rays, visible rays, far ultraviolet rays, X rays, electron beams, and the like. As ray sources of radiations, a low-pressure mercury vapor lamp, a high-pressure mercury vapor lamp, a ultrahigh-pressure mercury vapor lamp, KrF, ArF, and $F_2$ excimer laser are exemplified.

After that, a development is performed, whereby the unexposed area of the photoresist layer is removed to form a photoresist pattern (photo-cured pattern) having a film thickness of 10-150 μm. The development can be performed by common methods. In the foregoing negative-working photoresist, an alkaline aqueous solution is used as a developing solution. Specific examples thereof include sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane. The development time is not particularly limited but is usually from about 30 to 360 seconds. Conventional methods can be used for the development, such as an immersion method, a paddle method, and a spray method.

Thereafter, a photoresist-uncovered area (a metallic thin film-exposed area; i.e., an un-irradiated area) on the substrate is filled with a conductive metal to form a conductive layer (a bump formation). For filling the conductive metal, though arbitrary methods can be employed, an electroplating method is mainly used. There are thus formed bumps having a desired height. The bumps usually have a height of 20 μm or more. As the conductive metal for the bump formation, arbitrary metals such as Cu, Cu alloys, Al, Al alloys, Ni, Au, and solder are employed. The cleaning liquid of the invention is specifically effective for preventing corrosion of a substrate using Cu or solder as the conductive metal.

In the bump formation process, the photoresist pattern is thickly formed, and therefore, it is inevitable that the pattern is liable to cause deformation in its shape, such as collapse and deficiency, as compared with the case of a thin film pattern formed. If inconveniences, such as deforming in pattern shape, collapse and deficiency, are caused in the formation of photoresist patterns prior to the completion of the bump formation, it is necessary to remove away such deformed photoresist patterns from the substrate and again apply the substrate for the bump formation from the beginning ("re-work").

The cleaning liquid of the invention is specifically effective in removing the photoresist pattern after the bump has been formed, or in removing a deformed photoresist pattern for the re-work process.

That is, the cleaning liquid of the invention is brought into contact with a photoresist pattern after the bump formation or a deformed photoresist pattern for a re-work process where a bump has not yet been formed, thereby to remove those patterns.

In contacting the cleaning liquid with the photo-cured patterns, it is preferable to immerse the substrate entirely in a cleaning liquid tank. By contacting the substrate with the cleaning liquid, the photo-cured pattern is stripped away or fell down from the substrate while being partly dissolved, and further in the present invention, it exhibits extremely excellent effects such that the thus stripped-away cured pattern is rapidly dissolved. Even if the cured pattern is excellently stripped away from the substrate, if the stripped cured pattern is remained in the cleaning liquid tank without being rapidly dissolved, then there is the fear of the re-adhesion of the stripped-away photo-cured pattern or its residue to the substrate or to the subsequent substrate in a continuous processing.

The cleaning liquid of the invention allows the photo-cured pattern be stripped away from the substrate and be rapidly dissolved even in the case of the pattern is made of a negative-working photopolymerizable photoresist, which has hitherto been considered to be difficult for complete removal or to take a long period of time for removal, and further, even the pattern is thickly formed of 10-150 μm. The invention exhibits effects such as rapid stripping from a substrate and rapid dissolution of the cured pattern after being stripped away. Also, the invention is able to effectively prevent corrosion of the metallic thin film and bumps (conductive layer) on the substrate. Further, the present invention can prevent a formation of a degenerated film at the interface between the bump and the photoresist pattern.

The immersion time of the substrate may be a time sufficient for stripping of the photoresist pattern from the substrate and is not particularly limited, but is usually from about 10 seconds to 20 minutes. The processing temperature is preferably about 25-90° C., and particularly about 40-80° C. In the cleaning liquid of the invention, cured materials could be completely dissolved within a time of about 5-60 minutes. To the contrast, in the conventional cleaning liquids, it took at least one hour for dissolving cured materials. It became possible to dissolve a thick photoresist within a short period of time according to the cleaning liquid of the invention.

Prior to the contact of the substrate having the photo-cured pattern thereon with the cleaning liquid of the invention, the substrate may be contacted with an aqueous solutions of ozone and/or an aqueous solution hydrogen peroxide.

EXAMPLES

The invention will be hereunder described in detail with reference to the following Examples, but it should not be construed that the invention is limited thereto. All compounding amounts are mass % unless otherwise indicated.

[Preparation of Cleaning Liquid]

Cleaning liquids as shown in Table 1 were prepared.

TABLE 1

| | Components (mass %) | | | |
|---|---|---|---|---|
| | Component (a) | Component (b) | Component (c) | Other components |
| Cleaning liquid 1 | TPAH (2) | DMSO (95) | (3) | — |
| Cleaning liquid 2 | TPAH (2) | DMSO (75) + SLF (20) | (3) | — |
| Cleaning liquid 3 | TPAH (2) | DMSO (75) + NMP (20) | (3) | — |
| Cleaning liquid 4 | MTPAH (2) | DMSO (95) | (3) | — |
| Cleaning liquid 5 | TBAH (5) | DMSO (50) + SLF (15) | (30) | — |
| Cleaning liquid 6 | TBAH (5) | DMSO (65) + NMP (15) | (15) | — |
| Cleaning liquid 7 | MTBAH (5) | DMSO (45) + NMP (30) | (20) | — |
| Comparative cleaning liquid 1 | — | DMSO (95) | (3) | TMAH (2) |
| Comparative cleaning liquid 2 | TPAH (0.4) | DMSO (99) | (0.6) | — |
| Comparative cleaning liquid 3 | TPAH (10) | DMSO (50) | (40) | — |
| Comparative cleaning liquid 4 | — | DMSO (80) | (9.76) | TMAH (0.24), MEA (10) |
| Comparative cleaning liquid 5 | — | DMSO (98) | (1.5) | TMAH (0.5) |
| Comparative cleaning liquid 6 | — | DMSO (50) + DMI (40) | (8) | TMAH (2) |
| Comparative cleaning liquid 7 | — | DPM (62.5) | (12.5) | TMAH (20), CA (5) |

The abbreviations in Table 1 for the respective components have the following meanings.
TPAH: Tetrapropylammonium hydroxide
MTPAH: Methyltripropylammonium hydroxide
TBAH: Tetrabutylammonium hydroxide
MTBAH: Methyltributylammonium hydroxide
DMSO: Dimethyl sulfoxide
SLF: Sulforane
NMP: N-Methyl-2-pyrrolidone
DMI: Dimethylimidazolidinone
DPM: Dipropylene glycol monomethyl ether
TMAH: Tetramethylammonium hydroxide
MEA: Monoethanolamine
CA: Catechol Examples 1-7 and Comparative Examples 1-14

A negative-working photoresist (PMER N-HC600, manufactured by Tokyo Ohka Kogyo Co., Ltd.) was coated on substrate having a Cu thin film thereon and dried to form a photoresist layer.

Next, the photoresist layer was exposed through a mask pattern and subjected to alkaline development to form a photo-cured pattern (film thickness: 20 μm).

The resulting substrate was immersed in the cleaning liquid shown in Table 1 (the immersion condition is as shown in Table 2) and then rinsed with pure water. At this time, the strippability and the solubility of the photoresist pattern (cured pattern) in the cleaning liquid and the state of corrosion of the metallic thin film (Cu thin film) were evaluated by the observation by SEM (scanning electron microscope). The results are shown in Tables 2 and 3.

[Strippability and Solubility of Cured Pattern in the Cleaning Liquid]

S: The cured pattern was completely stripped away from the substrate, and the stripped-away cured pattern in a liquid tank was completely dissolved, whereby no residue was found at all.

A: The cured pattern was stripped away from the substrate, but an undissolved portion of the stripped-away cured pattern in a liquid tank was slightly observed.

B: The cured pattern could not be stripped away from the substrate.

[State of Corrosion of Metallic Thin Film (Cu Thin Film)]

S: No corrosion was occurred at all on the Cu thin film.

A: A slight corrosion (chapping) was observed on the surface of the Cu thin film.

B: Corrosion was occurred on the surface of the Cu thin film.

TABLE 2

| | Cleaning liquid | Immersion condition | strippability and solubility of cured pattern in the cleaning liquid | State of corrosion of metallic thin film (Cu) |
|---|---|---|---|---|
| Example 1 | Cleaning liquid 1 | Immersed for 40 minutes (at 60° C.) | S | S |
| Example 2 | Cleaning liquid 2 | Immersed for 40 minutes (at 60° C.) | S | S |
| Example 3 | Cleaning liquid 3 | Immersed for 40 minutes (at 60° C.) | S | S |
| Example 4 | Cleaning liquid 4 | Immersed for 40 minutes (at 60° C.) | S | S |
| Example 5 | Cleaning liquid 5 | Immersed for 40 minutes (at 40° C.) | S | S |
| Example 6 | Cleaning liquid 6 | Immersed for 40 minutes (at 40° C.) | S | S |
| Example 7 | Cleaning liquid 7 | Immersed for 40 minutes (at 40° C.) | S | S |
| Comparative Example 1 | Comparative cleaning liquid 1 | Immersed for 40 minutes (at 60° C.) | S | B |
| Comparative Example 2 | Comparative cleaning liquid 2 | Immersed for 40 minutes (at 60° C.) | B | S |
| Comparative Example 3 | Comparative cleaning liquid 3 | Immersed for 40 minutes (at 60° C.) | S | B |
| Comparative Example 4 | Comparative cleaning liquid 4 | Immersed for 40 minutes (at 60° C.) | B | B |
| Comparative Example 5 | Comparative cleaning liquid 5 | Immersed for 40 minutes (at 60° C.) | B | A |
| Comparative Example 6 | Comparative cleaning liquid 6 | Immersed for 40 minutes (at 60° C.) | S | B |
| Comparative Example 7 | Comparative cleaning liquid 7 | Immersed for 40 minutes (at 60° C.) | A | B |

TABLE 2-continued

| | Cleaning liquid | Immersion condition | strippability and solubility of cured pattern in the cleaning liquid | State of corrosion of metallic thin film (Cu) |
|---|---|---|---|---|
| Comparative Example 8 | Comparative cleaning liquid 1 | Immersed for 40 minutes (at 40° C.) | B | S |
| Comparative Example 9 | Comparative cleaning liquid 2 | Immersed for 40 minutes (at 40° C.) | B | S |
| Comparative Example 10 | Comparative cleaning liquid 3 | Immersed for 40 minutes (at 40° C.) | A | A |
| Comparative Example 11 | Comparative cleaning liquid 4 | Immersed for 40 minutes (at 40° C.) | S | B |
| Comparative Example 12 | Comparative cleaning liquid 5 | Immersed for 40 minutes (at 40° C.) | B | S |
| Comparative Example 13 | Comparative cleaning liquid 6 | Immersed for 40 minutes (at 40° C.) | B | S |
| Comparative Example 14 | Comparative cleaning liquid 7 | Immersed for 40 minutes (at 40° C.) | A | B |

Examples 8-11 and Comparative Examples 15-16

Additionally, the cured patterns were evaluated with respect to the stripping and dissolution according to the same criteria as described above by using the cleaning liquids 1 and 3 and comparative cleaning liquid 6 by shortening the immersion time to 30 minutes and 20 minutes. The results are shown in Table 3.

TABLE 3

| | Cleaning liquid | Immersion condition | strippability and solubility of cured pattern in the cleaning liquid |
|---|---|---|---|
| Example 8 | Cleaning liquid 1 | Immersed for 30 minutes (at 60° C.) | S |
| Example 9 | Cleaning liquid 3 | Immersed for 30 minutes (at 60° C.) | S |
| Example 10 | Cleaning liquid 1 | Immersed for 20 minutes (at 60° C.) | A |
| Example 11 | Cleaning liquid 3 | Immersed for 20 minutes (at 60° C.) | S |
| Comparative Example 15 | Comparative cleaning liquid 6 | Immersed for 30 minutes (at 60° C.) | S |
| Comparative Example 16 | Comparative cleaning liquid 6 | Immersed for 20 minutes (at 60° C.) | A |

Example 12 and Comparative Examples 17-20

A negative-working photoresist (PMER N—HC600, manufactured by Tokyo Ohka Kogyo Co., Ltd.) was coated on a substrate having a Cu thin film thereon and dried to form a photoresist layer.

Then, the photoresist layer was exposed through a mask pattern and subjected to alkaline development to form a photo-cured pattern (film thickness: 20 μm).

After that, bumps were formed on the Cu thin film using a high-temperature solder by the electroplating process.

The resulting substrate was immersed (at 60° C. for 40 minutes) with each of the cleaning liquid 3 and the comparative cleaning liquids 1, 2, 3 and 6 and then subjected to rinsing processing with pure water. At this time, the strippability and solubility of the cured pattern and the state of corrosion of the metallic thin film (Cu thin film) were evaluated according to the foregoing evaluation criteria. Also, the state of corrosion of the bumps was observed by SEM (scanning electron microscope) and evaluated according to the following evaluation criteria. The results are shown in Table 4.

[State of Corrosion of Bumps]

S: No corrosion was occurred at all on the Cu thin film.

A: A slight corrosion (chapping) was observed on the surface of the Cu thin film.

B: Corrosion was occurred on the surface of the Cu thin film.

TABLE 4

| | Cleaning liquid | strippability and solubility of cured pattern in the cleaning liquid | State of corrosion of metallic thin film (Cu) | State of corrosion of bumps |
|---|---|---|---|---|
| Example 12 | Cleaning liquid 3 | S | S | S |
| Comparative Example 17 | Comparative cleaning liquid 1 | S | B | A |
| Comparative Example 18 | Comparative cleaning liquid 2 | B | S | S |
| Comparative Example 19 | Comparative cleaning liquid 3 | S | A | B |
| Comparative Example 20 | Comparative cleaning liquid 6 | S | B | A |

As described above in detail, by using the cleaning liquid of the invention, it is possible to not only excellently strip a thick photoresist pattern for the formation of a bump from a substrate but also rapidly and completely dissolve the stripped photoresist pattern in the cleaning liquid without causing re-adhesion to the substrate. Also, it is possible to improve the production efficiency.

What is claimed is:

1. A cleaning liquid for stripping and dissolving a photoresist pattern having a film thickness of 10-150 μm, which consists essentially of (a) 0.5-15 mass % of a quaternary ammonium hydroxide represented by the following general formula (I):

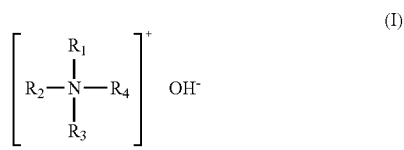

wherein all groups or at least three groups of $R_1$, $R_2$, $R_3$, and $R_4$ each independently represents an alkyl group or a hydroxyalkyl group each having 3-6 carbon atoms, and one group of $R_1$, $R_2$, $R_3$, and $R_4$ may represent an alkyl group or a hydroxyalkyl group each having 1-6 carbon atoms, (b) 65-97 mass % of a water-soluble organic solvent, and (c) 0.5-30 mass % of water, wherein component (b) is a mixed solvent of dimethyl sulfoxide and sulforane and/or N-methyl-2-pyrrolidone.

2. The cleaning liquid according to claim 1, wherein component (b) is a mixed solvent of dimethyl sulfoxide and N-methyl-2-pyrrolidone.

3. The cleaning liquid according to claim 1, wherein component (a) is at least one member selected from tetrapropylammonium hydroxide, tetrabutylammonium hydroxide, methyltripropylammonium hydroxide, and methyltributylammonium hydroxide.

4. The cleaning liquid according to claim 1, which contains 1-10 mass % of component (a), 70-96 mass % of component (b), and 1-25 mass % of component (c).

5. The cleaning liquid according to claim 1, wherein the photoresist pattern is a photo-cured pattern formed using a negative-working photoresist composition that is polymerized upon irradiation with radiations and becomes insoluble in alkalis.

6. A method for treating a substrate, comprising forming a photoresist pattern having a film thickness of 10-150 μm on a substrate having a metallic thin film thereon, providing a conductive layer on a metallic thin film-exposed area or a photoresist pattern uncovered area, and bringing the photoresist pattern into contact with the cleaning liquid according to any one of claims 1 or 2-5 to strip and dissolve the photoresist pattern.

7. The method for treating a substrate according to claim 6, wherein the photoresist pattern is a photo-cured pattern formed using a negative-working photoresist composition that is polymerized upon irradiation with radiations and becomes insoluble in alkalis.

8. A method for treating a substrate, comprising forming a photoresist pattern having a film thickness of 10-150 μm on a substrate having a metallic thin film thereon, bringing the photoresist pattern into contact with the cleaning liquid according to any one of claim 1 or 2-5 to strip and dissolve the photoresist pattern, without providing a conductive layer on a metallic thin film-exposed area or a photoresist pattern uncovered area.

9. The method for treating a substrate according to claim 8, wherein the photoresist pattern is a photo-cured pattern formed using a negative-working photoresist composition that is polymerized upon irradiation with radiations and becomes insoluble in alkalis.

10. A cleaning liquid for stripping and dissolving a photoresist pattern having a film thickness of 10-150 μm, which consists of (a) 0.5-15 mass % of a quaternary ammonium hydroxide represented by the following general formula (I):

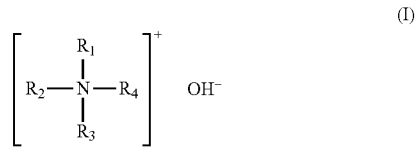

wherein all groups or at least three groups of $R_1$, $R_2$, $R_3$, and $R_4$ each independently represents an alkyl group or a hydroxyalkyl group each having 3-6 carbon atoms, and one group of $R_1$, $R_2$, $R_3$, and $R_4$ may represent an alkyl group or a hydroxyalkyl group each having 1-6 carbon atoms, (b) 65-97 mass % of a water-soluble organic solvent, and (c) 0.5-30 mass % of water, wherein component (b) is dimethyl sulfoxide singly or a mixed solvent of dimethyl sulfoxide and at least one other water-soluble organic solvent selected from the group consisting of sulfones, amides, lactams, polyhydric alcohols and derivatives thereof.

\* \* \* \* \*